(12) United States Patent
Mori et al.

(10) Patent No.: US 8,585,914 B2
(45) Date of Patent: Nov. 19, 2013

(54) PRODUCTION METHOD FOR VEHICLE WINDOW GLASS

(75) Inventors: Takeshi Mori, Matsusaka (JP); Takeshi Hosokawa, Matsusaka (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 13/497,438

(22) PCT Filed: Dec. 22, 2010

(86) PCT No.: PCT/JP2010/073211
§ 371 (c)(1),
(2), (4) Date: Mar. 21, 2012

(87) PCT Pub. No.: WO2011/089822
PCT Pub. Date: Jul. 28, 2011

(65) Prior Publication Data
US 2012/0276323 A1    Nov. 1, 2012

(30) Foreign Application Priority Data

Jan. 19, 2010 (JP) ................. 2010-008851
Dec. 2, 2010 (JP) ................. 2010-268892

(51) Int. Cl.
*B44C 1/22* (2006.01)
(52) U.S. Cl.
USPC ............................................. 216/31; 216/65
(58) Field of Classification Search
USPC ...................................................... 216/31, 65
See application file for complete search history.

(56) References Cited

U.S. PATENT DOCUMENTS 6,356,236 B1 * 3/2002 Maeuser et al. .............. 343/713

FOREIGN PATENT DOCUMENTS

| JP | 7-242441 A | 9/1995 |
|---|---|---|
| JP | 2000-80483 A | 3/2000 |
| JP | 2003-66212 A | 3/2003 |
| JP | 2005-66761 A | 3/2005 |
| JP | 2005-186209 A | 7/2005 |
| JP | 2005-310472 A | 11/2005 |
| JP | 2007-280774 A | 10/2007 |

OTHER PUBLICATIONS

PCT/ISA/237 Form (Four (4) pages).
International Search Report including English language translation dated Feb. 1, 2011 (Five (5) pages).

* cited by examiner

*Primary Examiner* — Roberts Culbert
(74) *Attorney, Agent, or Firm* — Crowell & Moring LLP

(57) ABSTRACT

[Object] To provide a method for producing a vehicle window glass pane that possesses both a solar radiation energy blocking function and a radio wave transmitting function.
[Means for achieving the Object] A method for producing a vehicle window glass pane on which an infrared reflective film is formed by a vacuum film forming method, which is characterized by having a process in which an edge portion of an infrared reflective film having a radio wave transmissible window produced by using a masking member is removed by dry etching, and further characterized in that the dry etching is carried out by using a grindstone or a laser.

8 Claims, No Drawings

PRODUCTION METHOD FOR VEHICLE WINDOW GLASS

CONTINUING DATA

This case is a national stage entry of PCT/JP2010/073211 filed Dec. 22, 2010.

TECHNICAL FIELD

The present invention relates in general to a vehicle window glass (or vehicle window glass pane) that has an infrared reflective film formed thereon, and more particularly to a method for producing a vehicle window glass pane that has thereon an infrared reflective film with radio wave transmissible portions.

BACKGROUND ART

In view of energy saving represented by reduction in cooling load, there has been a growing tendency to make the influence of infrared rays as small as possible. With this tendency, in current years, in the field of vehicle window glass panes, for the purpose of reducing the cooling load by suppressing a temperature increase in a vehicle cabin by blocking solar radiation energy (which will be sometimes referred to insolation energy in the following) from entering into the vehicle cabin, there has been highly recommended to adopt a heat shielding glass pane that has on its outer surface an infrared reflective film for reflecting infrared.

In general, as an infrared reflective film formed on a glass pane, there are known a film (ITO film) made from a mixture of indium and tin oxide, a conductive thin film represented by a zinc oxide film to which aluminum is added, a laminated thin body having a silver film put between dielectric films, a laminated thin body having a nitride film put between dielectric films and the like.

It is general that the above-mentioned infrared reflective films are each formed on an entire surface of the window glass pane through which the infrared enters. However, since the above-mentioned conductive thin film and laminated thin bodies are able to reflect a light and a radio wave in a wide range of wavelength, the thin film and thin bodies tend to induce a radio wave interference, such as communication disturbance of portable telephones, deterioration of gain of a glass antenna provided on the vehicle window glass pane or the like, when the same are used as the infrared reflective film for the vehicle window glass pane.

In view of the above-mentioned undesired facts, one method has been proposed in which for obtaining a suitable radio wave transmissibility, the window glass pane is partially formed with radio wave transmissible areas (which will be sometimes referred to radio wave transmissible windows in the following) at portions other than those where the above-mentioned conductive thin film and the laminated thin bodies are provided (Patent Document 1).

For producing the conductive thin film and the laminated thin bodies, a vacuum film forming method such as sputtering method, CVD method (chemical vapor deposition method) or the like has been widely employed. In general, for producing the above-mentioned radio wave transmissible window in case of forming the thin film by using the vacuum film forming method, it is know to employ a masking method (Patent Document 2) in which before the film forming, a masking member, such as a metal plate, a film member or the like, is placed on a part where the radio wave transmissible window is to be produced or a wet etching method (Patent Document 3) in which part of the produced conductive thin film or part of the produced laminated thin bodies is removed with work of acid. In addition to such methods, it is also widely known to employ a method (which will be sometimes referred to dry etching method in the following) in which the produced infrared reflective film is processed or partially removed by using a grindstone (Patent Document 4), a laser (Patent Document 5), a reactive gas, radical or the like.

PRIOR ART DOCUMENTS

Patent Documents

Patent Document 1: Japanese Laid Open Patent Application (tokkaihei) 7-242441
Patent Document 2: Japanese Laid Open Patent Application (tokkai) 2005-310472
Patent Document 3: Japanese Laid Open Patent Application (tokkai) 2000-080483
Patent Document 4: Japanese Laid Open Patent Application (tokkai) 2005-186209
Patent Document 5: Japanese Laid Open Patent Application (tokkai) 2003-66212

DISCLOSURE OF INVENTION

Technical Problems

The above-mentioned masking method exhibits effectiveness in mass production and practicality. However, in case of forming a film by using the vacuum film forming method, because of a thickness and shape of the masking member, it tends to occur that the produced infrared reflective film has partially thicker portions at a boundary between the radio wave transmissible window and the infrared reflective film and/or the boundary fails to have a clear view. If the above-mentioned defects are produced, the heat shielding glass pane tends to make a diffused reflection and/or become opaque. Thus, when the window glass pane is used as a vehicle window glass pane, the visibility from the interior of the vehicle is spoiled.

As the infrared reflective film formed on the vehicle window glass pane, there are employed many types which contain metals such as Ag or the like, for obtaining a satisfied infrared reflectivity. However, the metal such as Ag fails to exhibit a satisfied durability against a chemical used in the wet etching method, and thus, if the wet etching is practically carried out, the produced infrared reflective film tends to have defective portions such as whity clouded portions due to presence of Ag. The defective portions fail to exhibit a satisfied infrared reflection and greatly lower the transparency for visible light.

Although the method of using a grindstone is a method for grinding off the infrared reflective film, the shape to which the grinding is applied has a limit and it tends to occur that a part of the glass pane to which the grinding is applied has a haze. If the window glass pane has such haze, an image viewed through the window glass pane becomes warped.

The method in which a laser is used is a method for radiating a laser onto given portions of the produced infrared reflective film and vaporizing the given portions with work of heat produced by the laser. However, if the area to which the laser radiation is applied increases, it tends to occur that the partial removal of the infrared reflective film becomes insufficient irrespective of increase of time for which the laser irradiation is maintained.

If it is intended to make the partial removal of the infrared reflective film in a short time, it is necessary to power up the laser. However, in this case, it tends to occur that the outer surface of the window glass pane gets damages causing easy breakage of the window glass pane.

In view of the problems as mentioned hereinabove, the present invention aims to provide a method for producing a vehicle window glass pane that blocks solar radiation energy and has a radio wave transmissibility.

Means for Solving the Problems

After doing serious efforts for eliminating the above-mentioned problems, the inventors have found that the problems can be solved by treating both a radio wave window produced by the masking method and an edge portion of a produced infrared reflective film that contacts the radio wave window, by a laser or a grindstone.

That is, the method for producing a vehicle window glass pane, according to the present invention, is a method for producing a vehicle window glass pane on which an infrared reflective film is formed by a vacuum film forming method, which is characterized by having a process in which an edge portion of an infrared reflective film having a radio wave transmissible window produced by using a masking member is removed by dry etching.

That is, a method for producing a vehicle window glass pane that has thereon an infrared reflective film produced by a vacuum film forming method, is characterized by including a process for setting a masking member on a glass pane, a process for forming an infrared reflective film on a surface of the glass pane on which the masking member is set, a process for, after forming the infrared reflective film, removing the masking member to produce a radio wave transmissible window, and a process for, after removing the masking member, removing, through a dry etching method, an edge portion of the infrared reflective film that is in contact with a boundary between a non-film portion (radio wave transmissible window) and a film portion (infrared reflective film).

The radio wave transmissible window is a part of the vehicle window glass pane where the infrared reflective film is not formed. The radio wave transmissible window has an area of which size is sufficient for transmitting therethrough the radio wave, and the radio wave transmissible window is set to transmit therethrough not less than 50% of light in wavelength of 900 to 1400 nm.

The edge portion of the infrared reflective film is an edge portion of the infrared reflective film that is in contact with the radio wave window produced by using the masking member, and the edge portion contains the portion where the above-mentioned defects are provided.

Furthermore, the method for producing a vehicle window glass pane, according to the present invention, is characterized by using a grindstone or a laser for carrying out the dry etching.

Furthermore, the method for producing a vehicle window glass pane, according to the present invention, is characterized in that the infrared reflective film is a conductive thin film.

Effects of the Invention

According to the present invention, it is possible to provide an infrared reflective film with a radio wave transmissible window without spoiling a visibility fundamentally possessed by a vehicle window glass pane. As one of suitable advantages, the damage given to the glass pane is reduced because the area to which the laser or grindstone is practically applied is small.

EMBODIMENTS FOR CARRYING OUT THE INVENTION

The glass pane may be colorless or colored so long as it is transparent. For example, blue, bronze, gray and green glass panes may be used, and the glass panes may be of a type that absorbs ultraviolet rays and infrared rays. Furthermore, usage of tempered and semi-tempered glass panes is possible, and a glass pane is usable even though the material of the glass pane is inorganic or organic. It is desirable that the thickness of the glass pane is 1.6 to 5.0 mm.

The infrared reflective film is usable when it possesses a suitable infrared reflectivity and a suitable transparency for visible rays. As a main component of the glass pane for reflecting infrared rays, there are listed Ag, Zn, Ti, Sn, Cr, Nb, Ta, Al, In, ITO, ATO, AZO, GZO, IZO and the like. These components may be used for a metal film or a conductive thin film. Furthermore, these components may be used for a laminated thin body that is produced by piling up the metal films and conductive thin films, and dielectric films, in which the metal films and conductive thin films contain the above-mentioned component as the main component. Additionally, the above-mentioned heat rays reflective layer may be an optical interference film that is produced by piling up a plurality of dielectric thin bodies one after another.

Furthermore, the produced infrared reflective film may not be limited to a certain value in thickness so long as the thickness does not spoil the infrared reflectivity and visibility nor induce production of defects such as cracks or the like. For example, the thickness may be equal to or smaller than 300 nm. Preferably, the thickness is equal to or smaller than 50 nm.

In case wherein a conductive thin film is used for the infrared reflective film and the surface resistance of the conductive thin film is equal to or lower than 500Ω/□, the produced glass pane is suitable as a heat shielding glass pane since it exhibits a desired infrared reflectivity, because the infrared reflective film can reflect a radio wave of lower frequency due to work of plasma oscillation. Furthermore, if the above-mentioned infrared reflectivity has a maximum value that exceeds 50% in a wavelength range from 900 nm to 1400 nm, the produced glass pane is suitable as a vehicle laminated glass pane.

The vehicle window glass pane according to the invention is produced through a vacuum film forming method. As examples of this method, there are listed spattering method, electron beam deposition method, ion beam deposition method, ion plating method and the like. In these methods, the spattering method is most suitable since it can exhibit uniformity of a film. As examples of the spattering method, there are listed DC (direct current) spattering method, AC (alternating current) spattering method, high frequency spattering method, magnetron spattering method and the like. Among them, the DC magnetron spattering method and the AC magnetron spattering method are most suitable since these methods are stable in process and facilitate a film forming on a large area.

In case of forming radio wave transmissible windows, it is desirable to use either one of a grindstone and a laser, and selection may be suitably made in accordance with the shape and position of the infrared reflective film. Preferably, the grindstone is of a type that is set to a power grinding machine. As examples of material of the grindstone, there are listed diamond, SiC, alumina, BN materials, and as examples of a binding material, there are listed materials that are produced by conductive materials, such as iron, cast iron, carbon and the like.

The grain size and peripheral velocity of the grindstone may be suitably selected in accordance with a required surface state. For example, it is possible that the grain size is 0.6 to 20 μm and a peripheral velocity is 800 to 1200 m/min. Furthermore, as the need arises, coolant may be used.

The laser may be a known laser. As examples of the laser, there are listed ruby laser, YAG laser, gas laser such as carbon dioxide laser and the like. Among them, the YAG laser (wave length: 1060 nm or 1064 nm) is most suitably used. Preferably, the beam diameter is 0.5 to 1.5 mm. The width of a part of the infrared reflective film, which is to be removed, can be changed by a lens, and thus, a desired width can be easily set. Preferably, the beam intensity is 20 to 500 W. If the beam intensity is a value other than the range, it tends to occur that the glass pane is damaged and the removal of the part from the infrared reflective film is insufficient.

The working speed may be 400 to 8000 $mm^2$/sec. The laser beam may be irradiated directly to the film surface of the infrared reflective film or from the glass pane surface. However, it is preferable that the laser beam is irradiated from the glass pane surface since the beam intensity is easily adjustable.

The film-fitted glass pane, which is a glass pane on which the infrared reflective film is formed, may be used as a single glass pane, a laminated glass pane, a multi-layered glass pane or the like. As examples of the vehicle window glass pane, there are listed vehicle windshield, rear window, side window, sun-roof, shade band and the like. Specially, the vehicle window glass pane is most suitable to the windshield. When used as the windshield of the motor vehicle, a laminated type is preferable.

In case of producing a laminated glass pane according to the present invention, a glass pane different from the above-mentioned film-fitted glass pane is prepared, a parting agent is splayed into a space defined between the film fitted glass pane and the glass pane, the two glass panes are combined to constitute a separably united body after the parting agent splaying, the separably united body of the glass panes is set on a holding member, and the separably united body is heated and then subjected to a bending process.

The bending process may be suitably selected from a group consisting of a self-weight method, a press method and the like. After the bending process, the two glass panes are cooled at room temperature, and then, a polymeric film, such as PVB, EVA or the like is put between the two glass panes, and then, the two glass panes are pressed to each other in an autoclave with work of hydraulic pressure or pneumatic pressure. With these steps, production of the laminated glass pane is achieved. In case of using PVB film, it is preferable that the heating temperature is set to 120 to 145° C. and the pressure is set to $1.03 \times 10^6$ to $1.27 \times 10^6$ $Pa/m^2$.

In the following, the present invention will be described with reference to a best mode embodiment. However, the invention is not limited to the construction which will be described in the following.

First, a float glass pane (500 mm×300 mm) having a thickness of 2.1 mm is cleaned or washed by using in order neutral detergent, rinse water and isopropyl alcohol and finally dried.

Then, a rectangular masking member (150 mm×150 mm) is put on one surface of the dried glass pane, and then, by using a DC magnetron sputtering device, a laminated film containing Ag film is formed on the glass pane. To form the laminated film, a vacuum chamber of the device is deaerated to a degree of about $5 \times 10^{-4}$ Pa by a vacuum pump, and then, a sputtering gas is led into the vacuum chamber by an amount that causes the pressure in the vacuum chamber to show 0.36 Pa, and then, the glass pane having the masking member put thereon is conveyed for forming on an entire surface thereof an infrared reflective film.

Once the infrared reflective film is formed, the masking member is removed, and then, by using Nd-YAG laser, a laser beam is applied to the infrared reflective film keeping a beam irradiation angle at 90 degrees to remove an edge portion of the infrared reflective film. After removal of the edge portion of the film, cleaning and drying are applied to the glass pane. With these steps, a suitable vehicle window glass pane having radio wave transmissible windows is obtained.

The invention claimed is:

1. A method for producing a vehicle window glass pane on which an infrared reflective film is formed by a vacuum film forming method,
   which is characterized by including:
   a process for setting a masking member on a glass pane;
   a process for forming an infrared reflective film on a surface of the glass pane on which the masking member is set;
   a process for, after forming the infrared reflective film, removing the masking member to produce a radio wave transmissible window; and
   a process for, after removing the masking member, removing, by dry etching, an edge portion of the infrared reflective film that is in contact with a boundary between a non-film portion (radio wave transmissible window) and a film portion (infrared reflective film).

2. A method for producing a vehicle window glass pane as claimed in claim 1, which is characterized in that the dry etching is carried out by using a grindstone or a laser.

3. A method for producing a vehicle window glass pane as claimed in claim 2, in which the grindstone is selected from a group consisting of diamond, SiC, alumina and BN.

4. A method for producing a vehicle window glass pane as claimed in claim 3, in which the grain size of the grindstone is 0.6 to 20 μm.

5. A method for producing a vehicle window glass pane as claimed in claim 4, in which the dry etching is carried out by setting the grindstone to a power grinding machine and turning the machine at such a speed that a peripheral velocity of the grindstone shows 800 to 1200 m/min.

6. A method for producing a vehicle window glass pane as claimed in claim 2, in which the laser is a YAG laser that radiates a laser of 1060 nm or 1064 nm in wave length.

7. A method for producing a vehicle window glass pane as claimed in claim 6, in which the beam diameter of the YAG laser is 0.5 to 1.5 mm and the beam intensity is 20 to 500 W.

8. A method for producing a vehicle window glass pane as claimed in claim 6, in which the working speed of the YAG laser is 400 to 8000 $mm^2$/sec.

* * * * *